United States Patent
Lang

(10) Patent No.: US 10,775,423 B2
(45) Date of Patent: Sep. 15, 2020

(54) VECTOR NETWORK ANALYZER ENABLING DEVICE

(71) Applicant: BAE Systems Information and Electronic Systems Integration Inc., Nashua, NH (US)

(72) Inventor: David A. Lang, San Diego, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 101 days.

(21) Appl. No.: 15/717,266

(22) Filed: Sep. 27, 2017

(65) Prior Publication Data

US 2019/0094278 A1    Mar. 28, 2019

(51) Int. Cl.
| | |
|---|---|
| *G01R 27/00* | (2006.01) |
| *G01R 35/00* | (2006.01) |
| *G01R 27/26* | (2006.01) |
| *G01R 27/28* | (2006.01) |

(52) U.S. Cl.
CPC .......... *G01R 27/26* (2013.01); *G01R 27/28* (2013.01)

(58) Field of Classification Search
CPC .. G01R 27/26; G01R 27/28; H04J 1/08; H04J 3/00
See application file for complete search history.

(56) References Cited

U.S. PATENT DOCUMENTS

| | | | |
|---|---|---|---|
| 6,396,287 B1* | 5/2002 | Kapetanic ............... | G01R 23/20 324/623 |
| 7,235,982 B1* | 6/2007 | Shoulders ............... | G01R 27/28 324/601 |
| 9,291,657 B2 | 3/2016 | Zaostrovnykh et al. | |
| 10,277,346 B1* | 4/2019 | Downey ................... | H04J 1/08 |
| 2014/0210473 A1* | 7/2014 | Campbell ............... | G01N 24/10 324/316 |

OTHER PUBLICATIONS http://www.keysight.com/upload/cmc_upload/All/BTB_Network_2005-1.pdf, Agilent Technologies, Network Analyzer Basics, document is undated but publicly available prior to Sep. 27, 2017, pp. 1-1 through 1-135.

* cited by examiner

*Primary Examiner* — Minh Q Phan
(74) *Attorney, Agent, or Firm* — Sand, Sebolt & Wernow LPA; Scott J. Asmus

(57) ABSTRACT

A system and method for analyzing a device under test is provided. The system includes a signal source for generating an incident signal. The incident signal is routed to one or more inputs of the device under test. The system further includes signal separation and routing circuitry for measuring a portion of the incident signal to provide a reference signal and for separating the incident signal and a reflected signal at the one or more inputs of the device under test. The signal separation circuitry for separating the incident signal and the reflected signal at the input of the device under test is accomplished by a resistive device. The system may further include sampling device operationally coupled to the resistive device. The system and method may further include a signal switching mechanism for sequentially routing time slices of two or more signals to be coherently compared.

18 Claims, 9 Drawing Sheets

VECTOR NETWORK ANALYZER ENABLING DEVICE

BACKGROUND

Technical Field

The present disclosure relates generally to system characterization devices. More particularly, the present disclosure relates to a system for analyzing a device under test which utilizes a resistive device and an assembly having a switching mechanism.

Background Information

Generally, vector network analyzers (VNAs) may be utilized to characterize various components, devices, systems and the like. Typically VNAs may stimulate electrical devices at particular frequencies and measure the responses of the stimulus. In other words, the VNAs may measure transmitted and reflected signals relative to the stimulus signal.

Some exemplary system characterizations that a VNA may perform include measuring radio frequency (RF) path loss or gain, diagnostics and/or troubleshooting (such as locating failed connectors or RF relays). Although VNAs are typically valuable system characterization devices, VNAs have some drawbacks associated with them including that they are typically expensive and often have bulky components.

SUMMARY

Issues continue to exist with system characterization devices. Thus, a need continues to exist for an improved device, system, and method of use for analyzing a device under test and for time domain multiplexed collection of two or more coherent signals. The present disclosure addresses these and other issues by providing a device, system, and method of use for analyzing a device under test and for the collection of two or more coherent signals.

In one aspect, the present disclosure may provide a system for analyzing a device under test comprising a signal source for generating an incident signal. The incident signal is routed to one or more inputs of the device under test. The system may further include signal separation and routing circuitry for measuring a portion of the incident signal to provide a reference signal and for separating the incident signal and a reflected signal at the one or more inputs of the device under test. The signal separation circuitry for separating the incident signal and the reflected signal at the input of the device under test is accomplished by a resistive device. The system may further include a sampling device operationally coupled to the resistive device. The system may further include a receiver operatively coupled with the signal separation and routing circuitry and the sampling device for receiving the incident signal and the reflected signal. The resistive device may be a pick-off tee.

In another aspect, the present disclosure may provide a system for time domain multiplexed collection of two or more coherent signals comprising a signal switching mechanism for sequentially routing time slices of two or more signals to be coherently compared. The signal switching mechanism selects each signal at predetermined time periods to create a combined signal. This results in the time slices of each signal being multiplexed into predetermined time slots. The rate of switching is at least equal to or greater than a Nyquist-Shannon sampling rate for each of the signals. The system may further include a sampling device operationally coupled to the signal switching mechanism for continuously sampling the combined signal. The phase coherency between each of the signals is maintained. The system may further include a receiver operatively coupled between the signal switching mechanism and the sampling device for receiving the combined signal. The receiver and sampling device maintain the amplitude accuracy between each of the signals.

In another aspect, the present disclosure may provide a method for analyzing a device under test. The method first provides the signal source for generating an incident signal. The incident signal is routed to one or more inputs of a device under test (DUT). The method then provides signal separation and routing circuitry for measuring a portion of the incident signal and a reflected signal at the one or more inputs of the DUT. The method utilizes a resistive device to separate the incident signal and the reflected signal at the input of the DUT. The method provides a sampling device operationally coupled to the resistive device for sampling the associated signals.

In another aspect, the present disclosure may provide a method for time domain multiplexed collection of two or more coherent signals. The method first provides a signal switching mechanism. The method utilizes the signal switching mechanism for sequentially routing time slices of two or more signals to be coherently compared. The method then utilizes the signal switching mechanism to select each signal at predetermined time periods to create a combined signal. This results in the time slices of each signal being multiplexed into predetermined time slots. The rate of switching is at least equal to or greater than a Nyquist-Shannon sampling rate for each of the signals. Next, the method utilizes a sampling device operationally coupled to the signal switching mechanism for continuously sampling the combined signal. The method maintains the phase coherency between each of the signals.

In another aspect, the present disclosure may provide a system for analyzing a device under test. The system includes a signal source for generating an incident signal. The incident signal is routed to one or more inputs of the device under test. The system further includes signal separation and routing circuitry for measuring a portion of the incident signal to provide a reference signal and for separating the incident signal and a reflected signal at the one or more inputs of the device under test. The signal separation circuitry for separating the incident signal and the reflected signal at the input of the device under test is accomplished by a resistive device. The system may further include sampling device operationally coupled to the resistive device. The system may further include a signal switching mechanism for sequentially routing time slices of two or more signals to be coherently compared.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
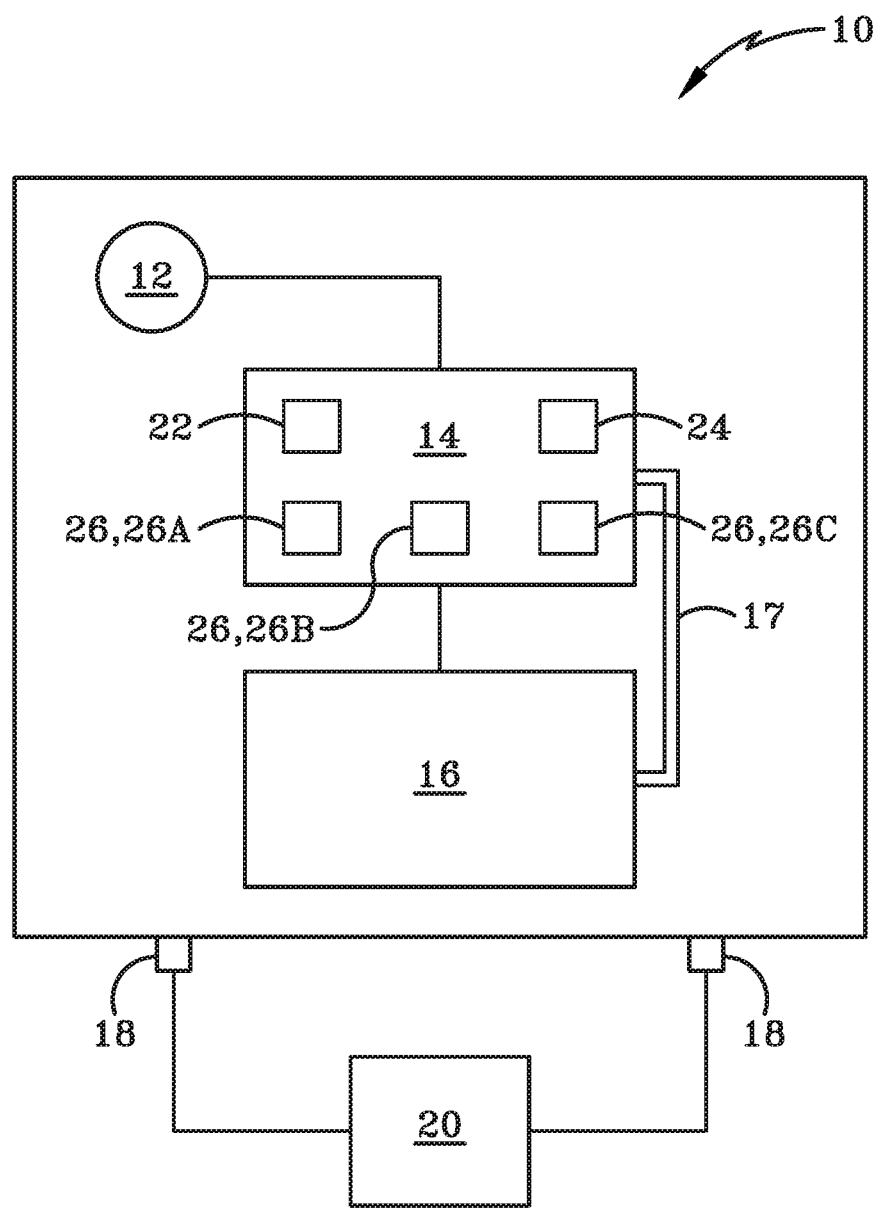
FIG. 1 is a block diagram of a system for analyzing a device under test in accordance with one embodiment.

As depicted in FIG. 1, a system for analyzing a device under test in accordance with one embodiment is broadly depicted as 10. System 10 may include a signal source 12, signal separation and routing circuitry 14, a signal collection mechanism 16, a temperature control device 17, at least one port 18 and a device under test (DUT) 20.

The signal source 12 may be an RF or microwave signal generator. The signal source 12 may produce an incident signal to stimulate the DUT 20. In one example, the signal source 12 may have a variable frequency which may be controlled by processor logic (not shown) and/or controlling logic (not shown). In one example, the frequency of the signal source 12 may be swept from about 20 megahertz (MHz) to about 18 gigahertz (GHz); however any suitable frequency may be utilized. A portion of the incident signal may be reflected from the DUT 20 and a portion of the incident signal may be transmitted through the DUT 20 as further described below. It is to be understood that the signal source 12 may be integral with the system 10 or external to the system 10. In the event the signal source 12 is external to the system 10, the signal source 12 may be operably connected with the signal separation and routing circuitry 14 in any suitable manner.

In one example, the signal separation and routing circuitry 14 may perform more than one function. The signal separation and routing circuitry 14 may route the incident signal to a desired port. This function may be accomplished with a transfer switch 22 as further described below.

In one example, the signal separation and routing circuitry 14 may reduce or attenuate the incident signal. This function may be accomplished with an adjustable amplitude control device 24, such as an attenuator as further described below.

The signal separation and routing circuitry 14 may separate a portion of the incident signal to provide a reference for ratioing. In other words, ratios of the incident signals, reflected signals and transmitted signals may be compared and ratioed as one of ordinary skill in the art would understand. This may be accomplished with signal separation devices 26 such as power splitters (or splitters) 26A, directional couplers or directional bridges 26B or resistive devices 26C. Splitters 26A are usually resistive, non-directional and broadband devices; however splitters 26A usually have about 6 decibel (dB) or more of loss in each arm. Directional couplers 26B have very low insertion loss (through the main arm) and suitable isolation and directivity. Directional couplers 26B are generally used in microwave network analyzers, however, their inherent high-pass response makes them unusable below about 40 MHz. The resistive device 26C (e.g. splitter or power divider) splits power equally or unequally and may, inter alia, replace the final separating device in conventional vector network analyzers or similar devices which is usually a directional coupler or directional bridge.

The signal separation and routing circuitry 14 may separate the incident (forward) and reflected (reverse) traveling signals at an input of the DUT 20. Again, directional couplers 26B are suitable in that they are directional, have low loss, and high reverse isolation; however, due to the difficulty of making broadband directional couplers 26B, bridges are often used instead. A known drawback associated with bridges is that they have loss which results in less signal power delivered to the DUT 20. In one example, this function may be better accomplished by utilizing the resistive device 26C. In one example, the resistive device 26C may be a pick-off tee; however, any suitable resistive device 26C may be utilized. Generally, pick-off tees operate over a wide frequency range (e.g. DC to greater than 40 GHz) and are small and less expensive compared to bridges and directional couplers 26B.

Figure 2:
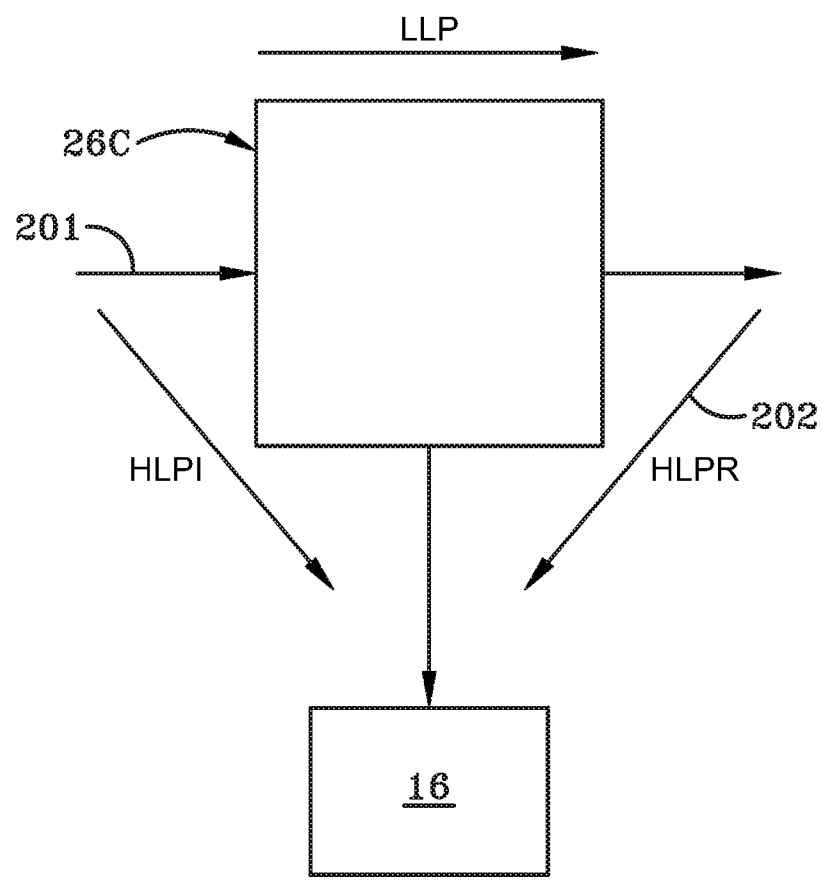
FIG. 2 is a block diagram of a resistive device in accordance with one embodiment.

In one example, and as shown in FIG. 2, an incident signal 201 travels through the low loss path LLP of the resistive device 26C, which in this case is a pick-off tee, and through the high loss path HLPI from the input side to the signal collection mechanism 16. A reflected signal 202 then returns and travels through the high loss path HLPR also to the signal collection mechanism 16. In one example, calibration techniques such as short-open-load-thru (SOLT) may be utilized to remove the contribution of the incident signal 201 from the high loss path HLPI as one of ordinary skill in the art would understand.

In one example, the signal collection mechanism 16 may comprise at least one receiver and at least one sampling device as further described below. In one example, the receiver and the sampling device may be integral, such as in a sampled downconverter, however, it is to be understood that the sampling device may be separate from the receiver. It is to be understood that the signal collection mechanism 16 may be integral with the system 10 or external to the system 10. In the event the signal collection mechanism 16 is external to the system 10, the signal collection mechanism 16 may be operably connected with the signal separation and routing circuitry 14 in any suitable manner.

Exemplary receivers include, but are not limited to, tuners, downconverters, spectrum analyzers, vector signal analyzers, mixers, sampled downconverters, and the like. Receivers typically convert an incoming signal to an intermediate frequency (IF) signal in any suitable manner. The receiver then typically performs various functions. For example, the receiver may perform carrier frequency tuning where the receiver selects a desired signal. In another example, the receiver may perform filtering where the receiver separates a signal from other modulated signals or extraneous signals created by frequency tuning. In yet another example, the receiver may perform amplification where the receiver compensates for transmission losses in the signal. The receiver may be configured to perform any suitable function.

In one example, the system 10 may include the temperature control device 17 to control the temperature stability of any or all of the components of the system 10. The temperature control 17 device may be any suitable temperature control device.

Figure 3:
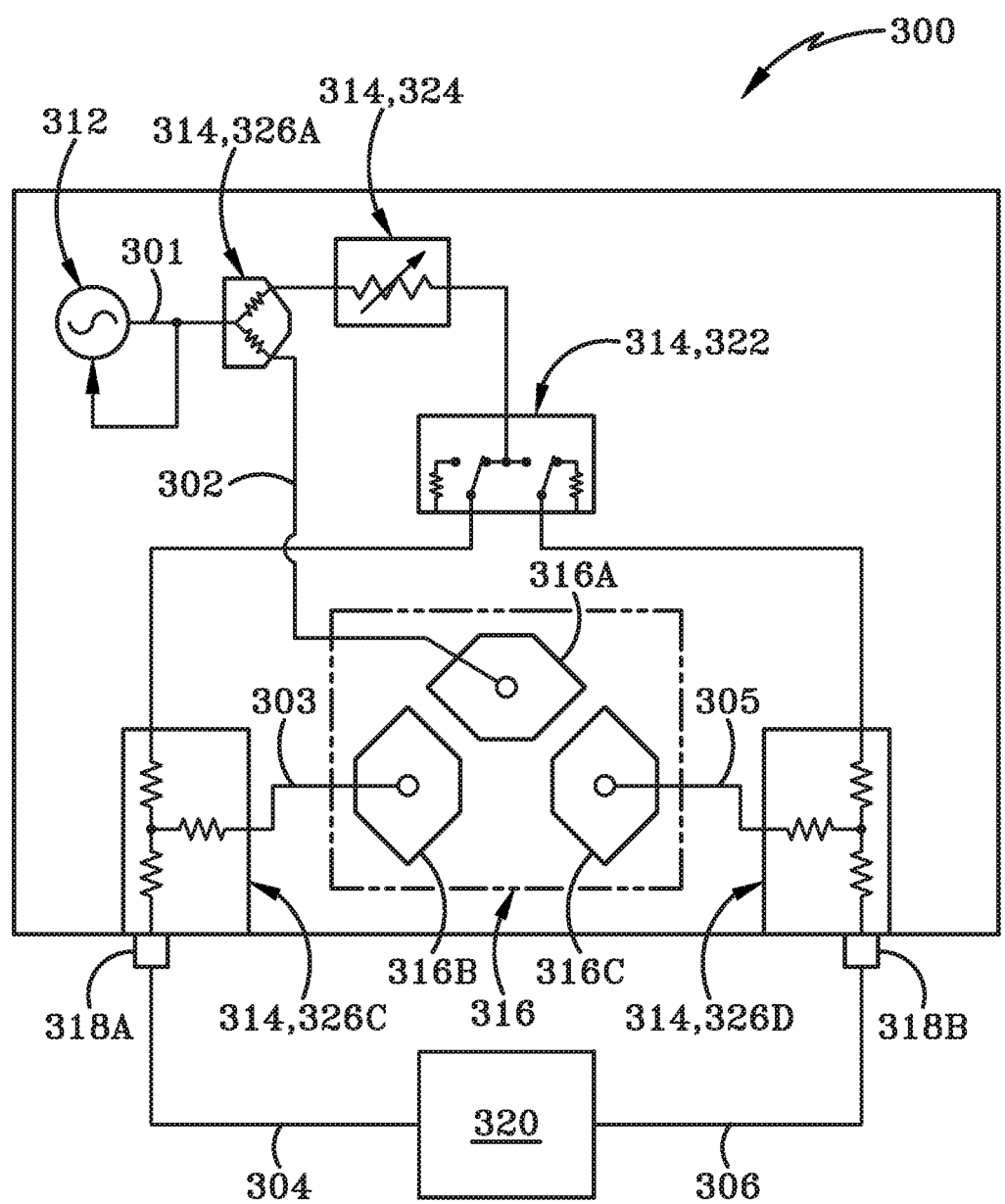
FIG. 3 is a block diagram of a system for analyzing a device under test in accordance with one embodiment.

In accordance with one aspect of the present disclosure, the system 10 for analyzing a device under test may be embodied in various configurations and/or architectures. One exemplary embodiment of the system which incorporates the resistive device 26C is shown in FIG. 3 and is generally depicted as 300. As depicted in FIG. 3, the system 300 may include a signal source 312, signal separation and routing circuitry 314, a signal collection mechanism 316, a first port 318A, a second port 318B and a DUT 320. The signal separation and routing circuitry 314 may include a splitter 326A, an adjustable amplitude control device 324, such as an attenuator, a transfer switch 322, a first resistive device 326C and a second resistive device 326D. The first resistive device 326C and second resistive device 326D may be pick-off tees or any other suitable resistive devices.

In this example, the signal collection mechanism 316 may include an assembly including a first receiver 316A, a second receiver 316B and a third receiver 316C. In this example, the splitter 326A is downstream from the signal source 312, the attenuator 324 is downstream from the splitter 326A, and the transfer switch 322 is downstream from the attenuator 324. The first receiver 316A is operably coupled with the splitter 326A. The first resistive device 326C is operably coupled to the first port 318A and the second resistive device 326D is operably coupled to the second port 318B. The second receiver 316B is operably coupled to the first resistive device 326C and the third receiver 316C is operably coupled to the second resistive device 326D.

In this example, the signal source 312 may generate an incident signal 301. The incident signal 301 may enter the signal separation and routing circuitry 14. More specifically, the incident signal 301 travels to the splitter 326A. The splitter 326A separates a portion of power of the incident signal 301 into a reference signal 302. The reference signal 302 travels to the first receiver 316A of the signal collection mechanism 316.

With continued reference to FIG. 3, the incident signal 301 continues to travel along the signal separation and routing circuitry 14 to the attenuator 324. The attenuator 324, controlled by a processor logic and/or controlling electronic logic, reduces or attenuates the incident signal 301. The incident signal 301 continues to travel along the signal separation and routing circuitry 14 to the transfer switch 322. The transfer switch 322 routes the incident signal 301 to the first or second port 318A, 318B respectively.

If the incident signal 301 is sent to the first port 318A, the incident signal 301 travels to the first resistive device 326C which in this embodiment is a pick-off tee. The incident signal 301 travels through the low loss path of the first resistive device 326C and through the high loss path from the input side to the second receiver 316B. A reflected signal 303 then returns and travels through the high loss path to the second receiver 316B. A transmitted signal 304 travels through the DUT 20 and is received at the third receiver 316C.

If the incident signal 301 is sent to the second port 318B, the incident signal 301 travels to the second resistive device 326D, which in this embodiment is a pick-off tee. The incident signal 301 travels through the low loss path of the second resistive device 326D and through the high loss path from the input side to the third receiver 316C. A reflected signal 305 then returns and travels through the high loss path to the third receiver 316C. A transmitted signal 306 travels through the DUT 20 and is received at the second receiver 316B.

Figure 4:
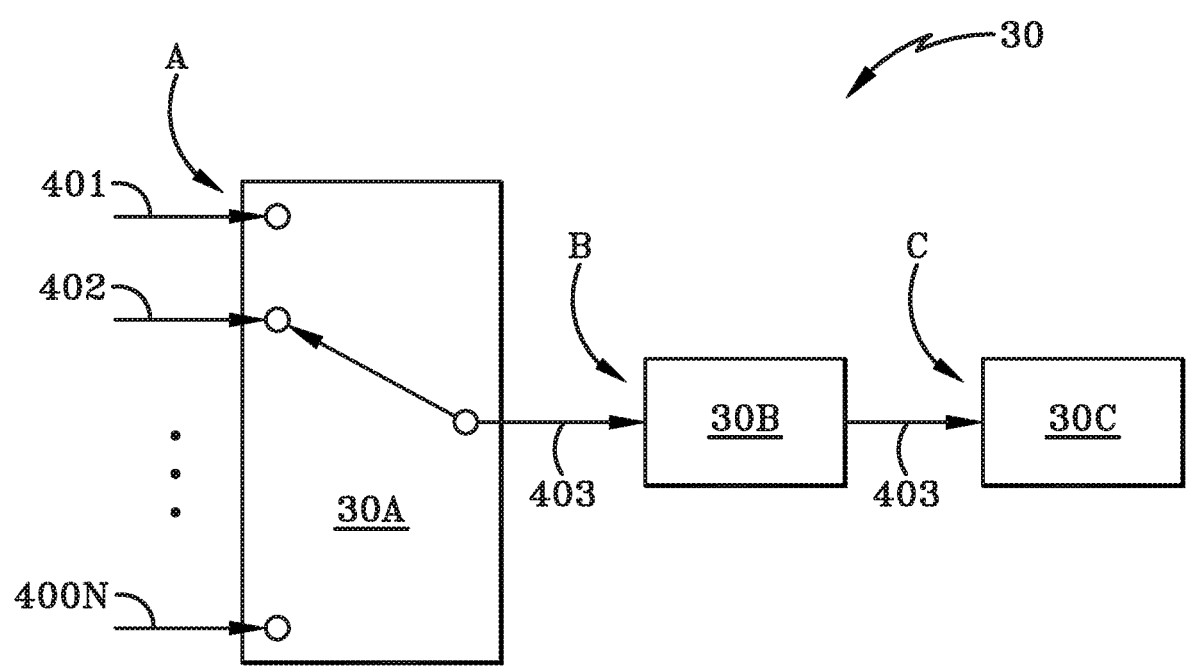
FIG. 4 is a block diagram of an assembly including a switch or signal switching mechanism, a single receiver mechanism, and a single sampling mechanism or sampling device in accordance with one embodiment.

In one aspect according to the present disclosure, and as shown in FIG. 4, an assembly 30 that collects data from two or more coherent signals using a switch or signal switching mechanism 30A, a single receiver mechanism 30B, and a single sampling mechanism or sampling device 30C may be utilized as opposed to multiple receivers and/or sampling devices. The assembly 30 is not required to be coherent with the incoming signals of interest. Further, the assembly 30 maintains the coherency and relative amplitude accuracy between the incoming signals as further described below.

FIG. 4 depicts a first signal 401, a second signal 402 and an Nth signal 400N. The assembly 30 routes a time slice of each signal, 401, 402, and 400N at interface A in FIG. 4 through the switch 30A to the receiver 30B. This creates a new signal 403 at interface B in FIG. 4. Each time slice is of predetermined length and is allocated to a predetermined time slot as shown in FIG. 4. Thus, there is a known delay between the time slices. The switch 30A may be a PIN Diode Switch.

The switch 30 is controlled by processor logic and/or electronic logic. The rate that the time slices are taken for each signal 401, 402 and 400N must be greater than or equal to the Nyquist-Shannon sampling rate of each of the signals 401, 402 and 400N. The receiver 30B takes the incoming combined signal 403 at interface B and translates it in frequency and adjusts its amplitude to prepare it to be sampled by the sampling device 30C.

Figure 5A:
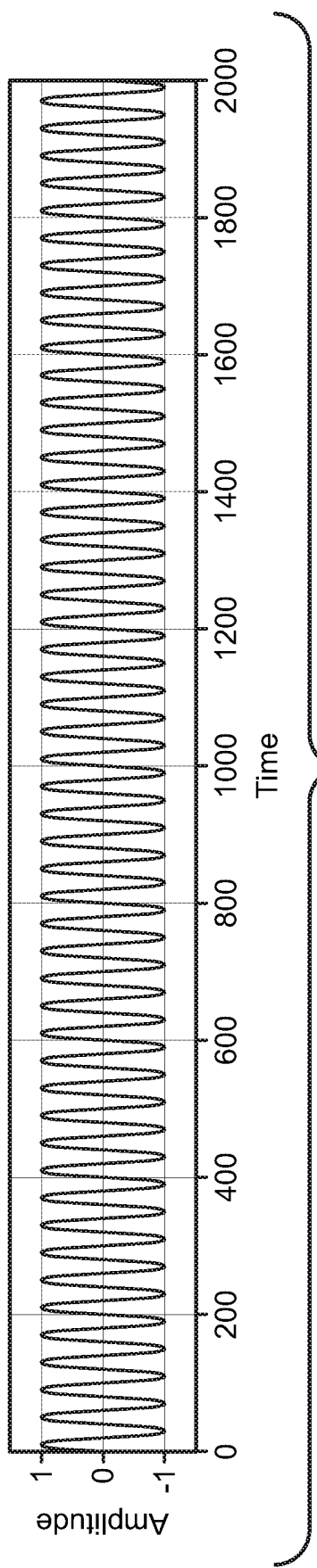
FIG. 5A is a representation of a signal in accordance with one embodiment.
Figure 5B:
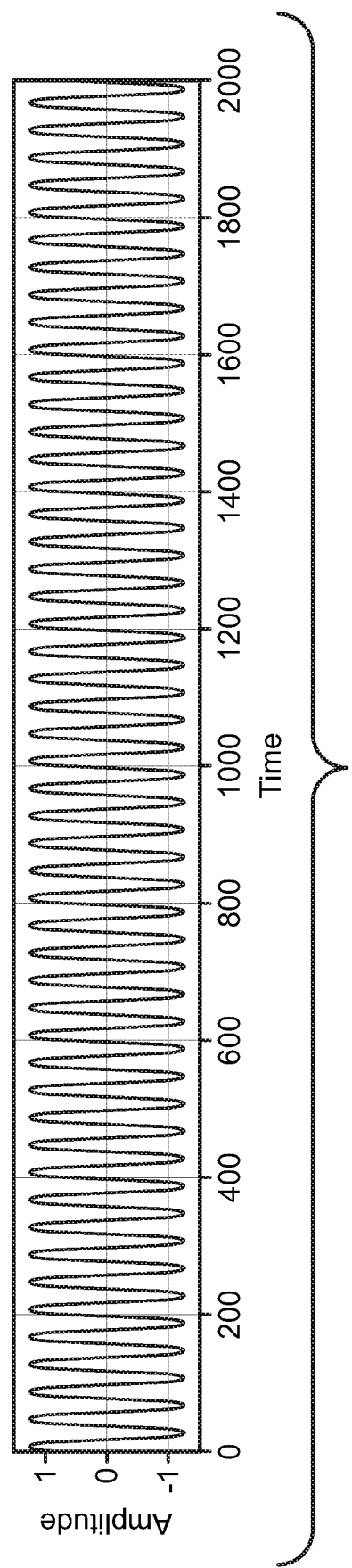
FIG. 5B is a representation of a signal in accordance with one embodiment.
Figure 5C:
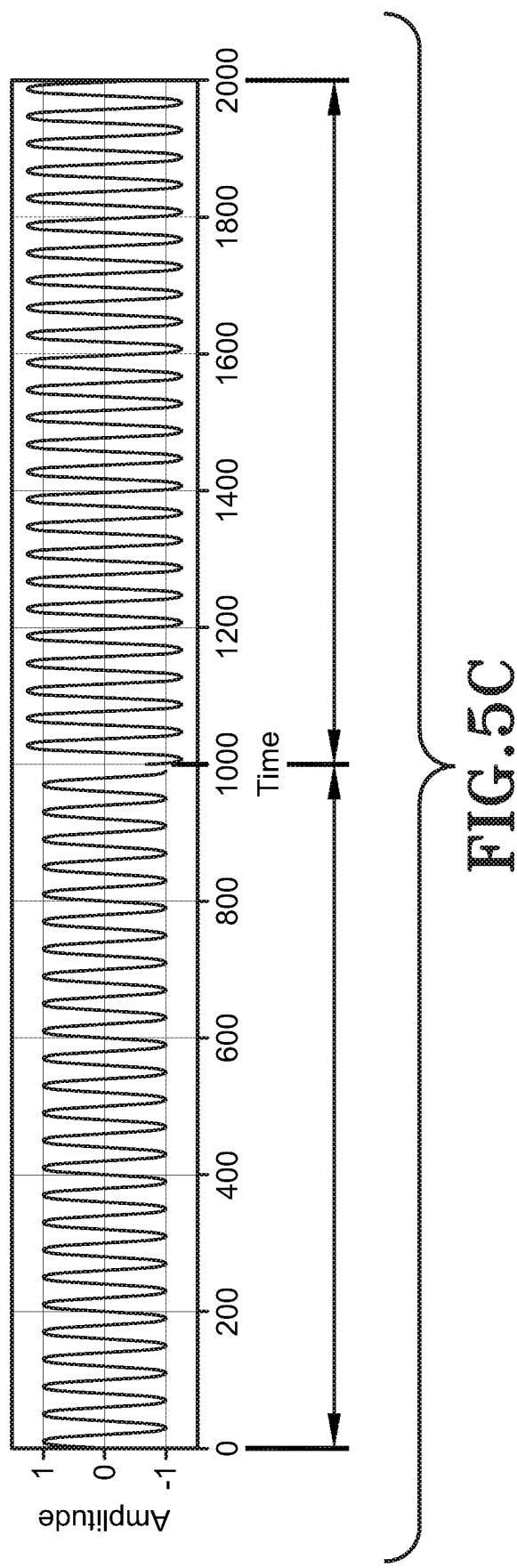
FIG. 5C is a representation of a combined signal in accordance with one embodiment.

The sampling device 30C (e.g. an analog to digital converter) continuously samples the combined received signal 403, from interface C, at a rate greater than or equal to the Nyquist-Shannon sampling rate of the combined signal 403. Once the signals 403 have been digitally sampled, the known delay is accounted for in a processor and/or electronic logic. This results in maintaining the coherency between each of the signals 401, 402, 400N and 403. A representation of signal 401 at interface A is shown in FIG. 5A. A representation of signal 402 is shown in FIG. 5B. A representation of signal 403 is shown in FIG. 5C.

The ability to account for the delay is reliant on the continuous sampling of the combined signal 403. This is because the assembly 30 records and stores samples of the combined signal 403 that are collected at precise time intervals (i.e. an analog to digital sampling clock (ADC) period) and therefore the relative timing of the incoming signals 401, 402 and 400N is known. For example, if the ADC has a sampling rate of 100 MHz, its sampling clock period will be 10 nanoseconds. If furthermore, the time interval between collecting signal 401 and collecting signal 402 is 10 microseconds, then there will be exactly 1000 samples of data collected for that time interval. Further, the switch 30A may introduce fixed delays between the signals 401, 402 and 400N. Since these delays are fixed the processor logic and/or the electronic logic accounts for them as part of the calibration as one of ordinary skill in the art would understand. It is understood that the assembly 30 may be utilized as a component of a vector network analyzer, a time domain reflectometer, which is an electronic instrument that uses time-domain reflectometry to characterize devices, or any other suitable device. In one example, the length of time for each slice of a signal is 10 microseconds. In another example, the length of time for each slice of a signal is 12.5 microseconds. In yet another example, the length of time for each slice of a signal is 50 microseconds. However, it is understood that the data may be collected at any suitable time period. Further, in one example, 100 mega-samples per second (MSPS) are collected, however, any suitable sample rate may be utilized.

Figure 6:
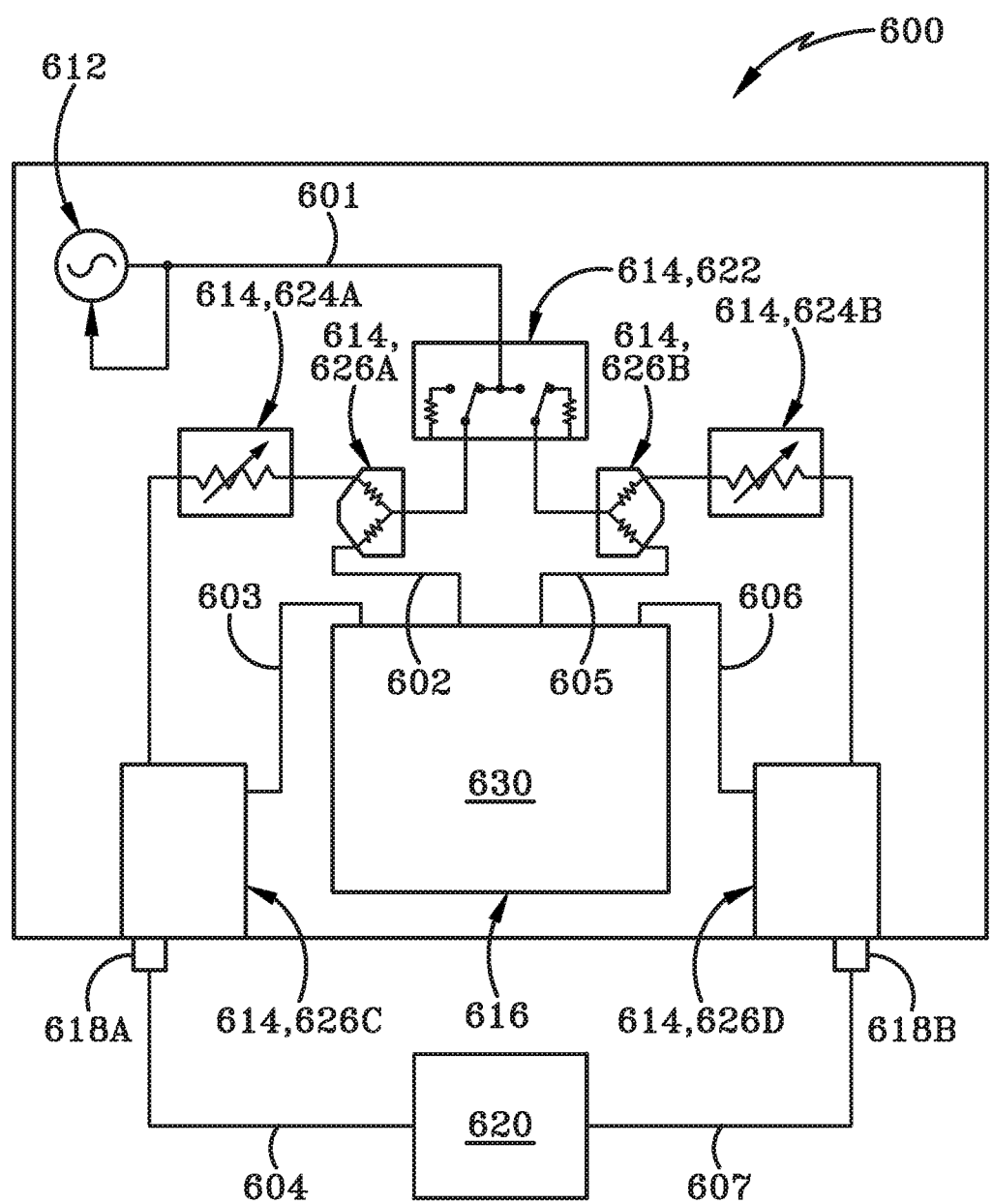
FIG. 6 is a block diagram of a system for time domain multiplexed collection of two or more coherent signals in accordance with one embodiment.

With reference to FIG. 6, another embodiment of a system in accordance with the present disclosure is generally depicted as 600. As depicted in FIG. 6, the system 600 may include the signal source 612, the signal separation and routing circuitry 614, the signal collection mechanism 616, which in this embodiment is the assembly 30 as described above and is depicted as 630 in FIG. 6, a first port 618A, a second port 618B and the DUT 620. The signal separation and routing circuitry 614 may include a transfer switch 622, a first splitter 626A, a second splitter 626B, a first attenuator 624A, a second attenuator 624B, a first signal separation device 626C and a second signal separation device 626D, each of which may be directional couplers or any other suitable signal separation device.

As shown in FIG. 6, and in this example, the transfer switch 622 is downstream from the signal source 612, the first splitter 626A and the second splitter 626B are downstream from the transfer switch 622, the first attenuator 624A is downstream from the first splitter 626A, and the second attenuator 624B is downstream from the second splitter 626B. The first signal separation device 626C is downstream from the first attenuator 624A and is operably coupled with the first port 618A and the assembly 630. The second signal separation device 626D is downstream from the second attenuator 624B and is operably coupled with the second port 618B and the assembly 630. The assembly 630 is further operably coupled with the first splitter 626A and the second splitter 626B.

In this exemplary embodiment, the signal source 612 may generate an incident signal 601. The incident signal 601 may enter the signal separation and routing circuitry 614. More specifically, the incident signal 601 travels to the transfer switch 622. The transfer switch 622 routes the incident signal 601 to the first or second port 618A, 618B respectively.

If the transfer switch 622 routes the incident signal 601 to the first port 618A, the incident signal 601 travels to the first splitter 626A which separates a portion of power of the incident signal 601 into a reference signal 602. The reference signal 602 travels to the assembly 630. The incident signal 601 travels to the first attenuator 624A. The first attenuator 624A, controlled by a processor logic and/or controlling electronic logic, reduces or attenuates the incident signal 601. The incident signal 601 then travels to the first signal separation device 626C. The incident signal 601 travels through the low loss path of the first signal separation device 626C and through the high loss path from the input side to the assembly 630. A reflected signal 603 then returns and travels through the high loss path to assembly 630. A transmitted signal 604 travels through the DUT 620 and is received at the assembly 630. The assembly 630 processes each received signal 601, 602, 603 and 604 as described above.

If the transfer switch 622 routes the incident signal 601 to the second port 618B, the incident signal 601 travels to the second splitter 626B which separates a portion of power of the incident signal 601 into a reference signal 605. The reference signal 605 travels to the assembly 630. The incident signal 601 travels to the second attenuator 624B. The second attenuator 624B, controlled by a processor logic and/or controlling electronic logic, reduces or attenuates the incident signal 601. The incident signal 601 then travels to the second signal separation device 626D. The incident signal 601 travels through the low loss path of the second signal separation device 626D and through the high loss path from the input side to the assembly 630. A reflected signal 606 then returns and travels through the high loss path to assembly 630. A transmitted signal 607 travels through the DUT 620 and is received at the assembly 630. The assembly 630 processes each received signal 601, 605, 606 and 607 as described above.

Figure 7:
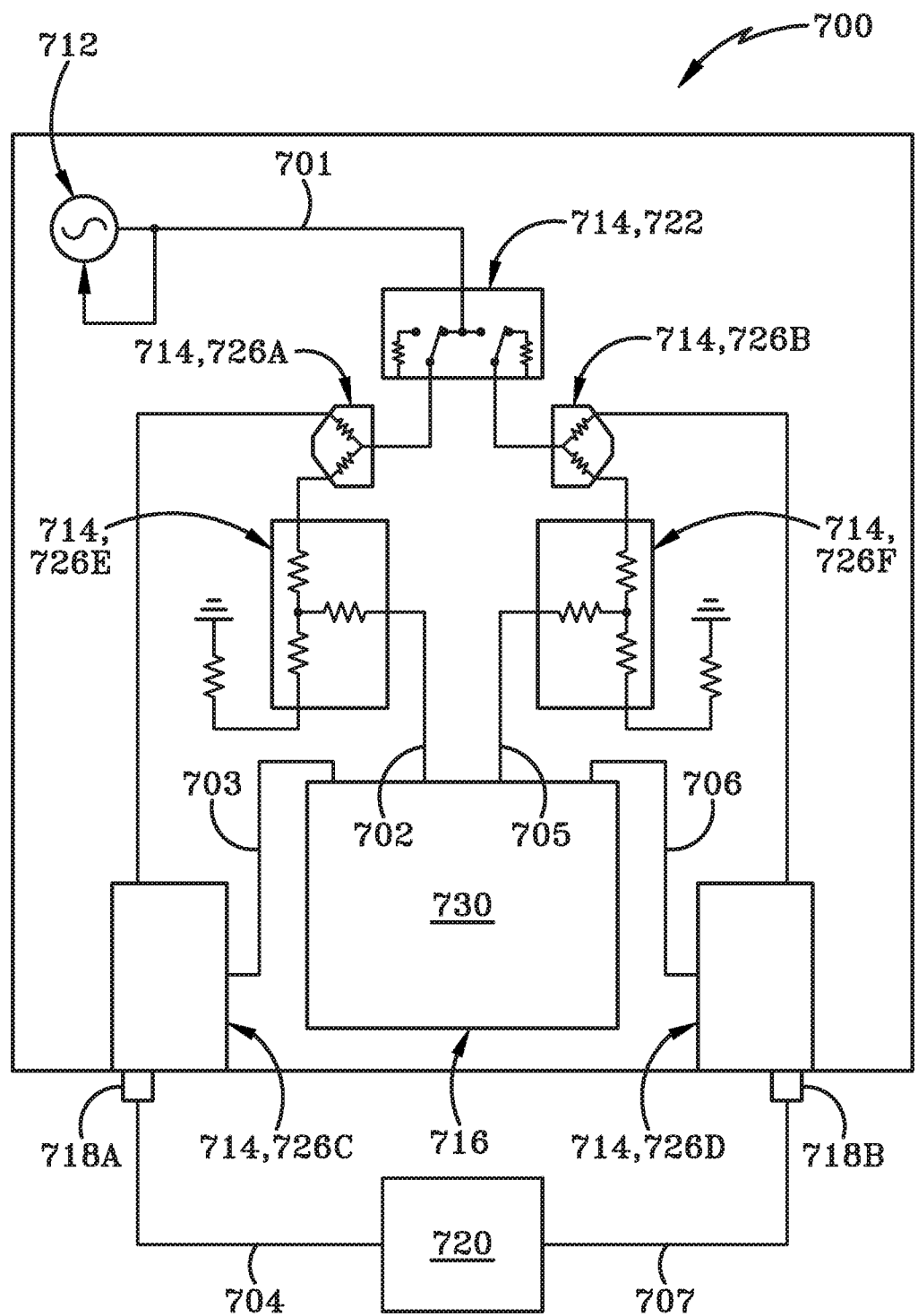
FIG. 7 is a block diagram of a system for time domain multiplexed collection of two or more coherent signals in accordance with one embodiment.

With reference to FIG. 7, another embodiment of a system in accordance with the present disclosure is generally depicted as 700. As depicted in FIG. 7, the system 700 may include the signal source 712, the signal separation and routing circuitry 714, the signal collection mechanism 716, which in this embodiment is the assembly 30 as described above and is depicted as 730 in FIG. 7, a first port 718A, a second port 718B and the DUT 720. The signal separation and routing circuitry 714 may include a transfer switch 722, a first splitter 726A, a second splitter 726B, a first resistive device 726C, a second resistive device 726E, a third resistive device 726D and a fourth resistive device 726F, each of which may be pick-off tees or any other suitable signal separation devices.

As shown in FIG. 7, and in this example, the transfer switch 722 is downstream from the signal source 712, the first splitter 726A and the second splitter 726B are downstream from the transfer switch 722, the first resistive device 726C and the second resistive device 726E are downstream from the first splitter 726A and third resistive device 726D and the fourth resistive device 726F are downstream from the second splitter 726B. The first resistive device 726C is operably coupled with the first port 718A and the assembly 730. The second resistive device 726E is operably coupled with the first splitter 726A and the assembly 730. The third resistive device 726D is operably coupled with the second port 718B and the assembly 730. The fourth resistive device 726F is operably coupled with the second splitter 726B and the assembly 730.

In this exemplary embodiment, the signal source 712 may generate an incident signal 701. The incident signal 701 may enter the signal separation and routing circuitry 714. More specifically, the incident signal 701 travels to the transfer switch 722. The transfer switch 722 routes the incident signal 701 to the first or second port 718A, 718B respectively. If the transfer switch 722 routes the incident signal 701 to the first port 718A, the incident signal 701 travels to the first splitter 726A which separates a portion of power of the incident signal 701 into a reference signal 702. The reference signal 702 travels to the second resistive device 726E and then to the assembly 730. The incident signal 701 travels to the first resistive device 726C. The incident signal 701 travels through the low loss path of the first resistive device 726C and through the high loss path from the input side to the assembly 730. A reflected signal 703 then returns and travels through the high loss path to the assembly 730. A transmitted signal 704 travels through the DUT 720 and is received at the assembly 730.

If the transfer switch 722 routes the incident signal 701 to the second port 718B, the incident signal 701 travels to the second splitter 726B which separates a portion of power of the incident signal 701 into a reference signal 705. The reference signal 705 travels to the fourth resistive device 726F and then to the assembly 730. The incident signal 701 travels to the third resistive device 726D. The incident signal 701 travels through the low loss path of the third resistive device 726D and through the high loss path from the input side to the assembly 730. A reflected signal 706 then returns and travels through the high loss path to the assembly 730. A transmitted signal 707 travels through the DUT 720 and is received at the assembly 730.

In this embodiment, the second resistive device 726E and the third resistive device 726D, which are both terminated in 50 ohms at one port as shown in FIG. 7, are added in the reference lines in order to decrease the difference in the signal levels between the measured and reference signals and also to improve amplitude and phase tracking between the measured and reference signals.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Figure 8:
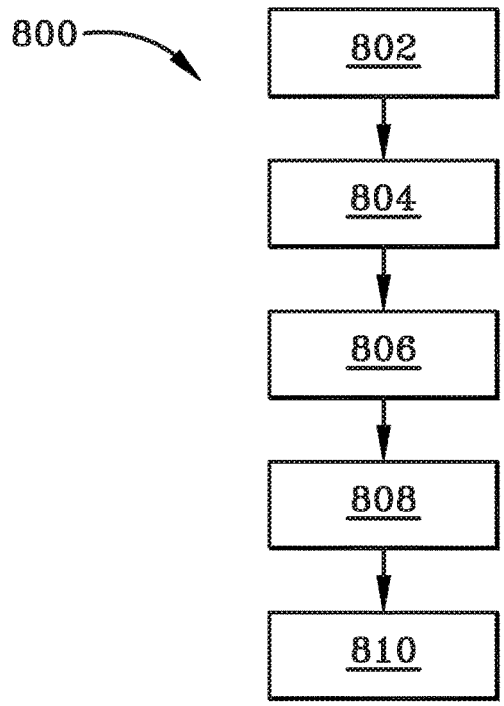
FIG. 8 is a flowchart of an exemplary operation of the system according to one embodiment.

In accordance with one aspect of the disclosure, reference is made to a method for analyzing a device under test depicted in the flowchart of FIG. 8. The method 800 first provides the signal source 12 for generating an incident signal, which is shown generally at 802. The incident signal is routed to one or more inputs of the DUT 20, which is shown generally at 804. The method 800 then provides signal separation and routing circuitry 14 for measuring a portion of the incident signal and a reflected signal at the one or more inputs of the DUT 20, which is shown generally at 806. The method 800 utilizes the resistive device 26C to separate the incident signal and the reflected signal at the input of the DUT 20, which is shown generally at 808. The method 800 provides the sampling device operationally coupled to the resistive device for sampling the associated signals, which is shown generally at 810.

Figure 9:
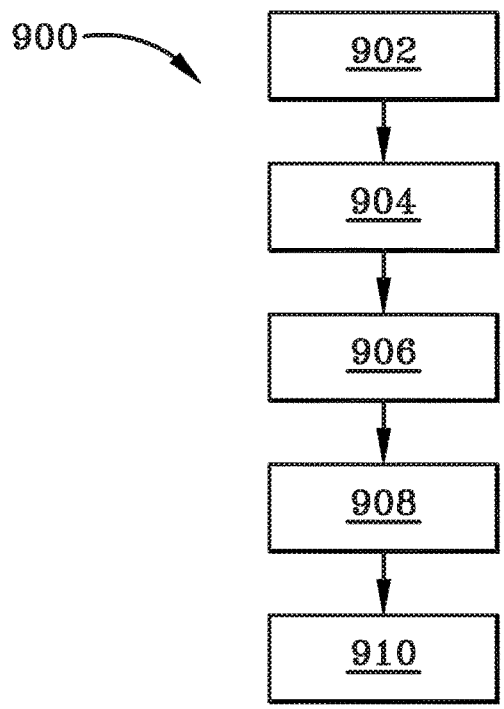
FIG. 9 is a flowchart of an exemplary operation of the system according to one embodiment.

In accordance with one aspect of the disclosure, reference is made to a method for time domain multiplexed collection of two or more coherent signals depicted in the flowchart of FIG. 9. The method 900 first provides the signal switching mechanism 30A as described above, which is shown generally at 902. The method 900 utilizes the signal switching mechanism 30A for sequentially routing time slices of two or more signals to be coherently compared, which is shown generally at 904. The method 900 then utilizes the signal switching mechanism 30A to select each signal at predetermined time periods to create a combined signal, which is shown generally at 906. This results in the time slices of each signal being multiplexed into predetermined time slots, which is shown generally at 908. The rate of switching is at least equal to or greater than the Nyquist-Shannon sampling rate for each of the signals. Next, the method 900 utilizes a sampling device operationally coupled to the signal switching mechanism for continuously sampling the combined signal, which is shown generally at 910. The method 900 maintains the phase coherency between each of the signals.

It is to be further understood that the teachings of the present disclosure may be incorporated with typical lab equipment, such as a spectrum analyzer, vector signal analyzer and a signal generator and/or may be incorporated into a stand-alone device including downconverter and signal generation functions integral within the stand-alone device. It is also envisioned that the teachings of the present disclosure may be adapted to enhance automatic level control of RF signals and phase noise analysis.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the disclosure are an example and the disclosure is not limited to the exact details shown or described.

The invention claimed is:

1. A system for analyzing a device under test comprising:
   a signal source for generating an incident signal; wherein the incident signal is routed to one or more inputs of the device under test;
   a signal separation and routing circuitry for separating a portion of the incident signal to provide a reference signal and for separating the incident signal and a reflected signal at the one or more inputs of the device under test; wherein the signal separation and routing circuitry for separating the incident signal and the reflected signal at the inputs of the device under test is accomplished by a resistive pick-off tee, and wherein the pick-off tee has a low loss path and a high loss path; and
   a sampling device operationally coupled to the pick-off tee for receiving the incident signal and the reflected signal through the high loss path.

2. The system of claim 1, further comprising:
   a receiver operatively coupled between the signal separation and routing circuitry and the sampling device for receiving the incident signal and the reflected signal.

3. A system for the collection of two or more coherent signals comprising:
- a signal switching mechanism for sequentially routing time slices of two or more signals to be coherently compared; wherein the signal switching mechanism selects each signal at predetermined time periods to create a combined signal; and wherein the time slices of each signal are multiplexed into predetermined time slots; and wherein the rate of switching is at least equal to or greater than a Nyquist-Shannon sampling rate for each of the signals; and
- a sampling device operationally coupled to the signal switching mechanism for continuously sampling the combined signal; wherein the sampling device maintains phase coherency between each of the signals.

4. The system of claim 3, further comprising:
- a receiver operatively coupled between the signal switching mechanism and the sampling device for receiving the combined signal; wherein the receiver maintains the amplitude accuracy between each of the signals.

5. The system of claim 3, further comprising:
- a signal source for generating the two or more signals; and
- a signal separation and routing circuitry for separating the two or more signals;

wherein the signal source and the signal separation and routing circuitry are electrically connected to the signal switching mechanism and the sampling device.

6. The system of claim 5, wherein the signal separation and routing circuitry includes a pick-off tee for separating the incident and reflected signals.

7. The system of claim 6, wherein the signal separation and routing circuitry includes an additional pick-off tee for balancing the incident and reflected signal levels.

8. The system of claim 4, further comprising:
- a signal source for generating the two or more signals; and
- a signal separation and routing circuitry for separating the two or more signals;

wherein the signal source and the signal separation and routing circuitry are electrically connected to the signal switching mechanism, the sampling device and the receiver.

9. The system of claim 8, wherein the signal separation and routing circuitry includes a pick-off tee for separating the incident and reflected signals.

10. The system of claim 9, wherein the signal separation and routing circuitry includes an additional pick-off tee for balancing the incident and reflected signal levels.

11. The system of claim 3, wherein the signal switching mechanism is a PIN diode switch.

12. The system of claim 3, wherein the sampling device is an analog to digital converter.

13. The system of claim 3, further comprising: a time domain reflectometer.

14. The system of claim 5, wherein at least one of the signal source, the signal separation and routing circuitry, the sampling device and the receiver are physically separated.

15. A method for the collection of two or more coherent signals comprising:
- sequentially routing, with a signal switching mechanism, time slices of two or more signals;
- coherently comparing the two or more signals;
- selecting, with the signal switching mechanism; each signal at predetermined time periods to create a combined signal;
- multiplexing the time slices of each signal into predetermined time slots; switching, with
- the signal switching mechanism, between each of the signals at a rate that is at least equal to or greater than a Nyquist-Shannon sampling rate for each of the signals;
- continuously sampling, with a sampling device, the combined signal; and
- maintaining phase coherency between each of the signals.

16. The method of claim 15, further comprising:
receiving, with a receiver, the combined signal; and
maintaining the amplitude accuracy between each of the signals.

17. The method of claim 15, wherein the step of sequentially routing, with a signal switching mechanism, time slices of two or more signals is accomplished with a PIN diode.

18. The method of claim 15, further comprising:
separating, with a signal separation and routing circuitry including a pick-off tee, incident and reflected signals.

* * * * *